(12) United States Patent
Gupta et al.

(10) Patent No.: US 11,444,635 B2
(45) Date of Patent: Sep. 13, 2022

(54) DELTA SIGMA MODULATOR

(71) Applicant: TEXAS INSTRUMENTS INCORPORATED, Dallas, TX (US)

(72) Inventors: Amit Kumar Gupta, Frisco, TX (US); Peng Cao, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/061,647

(22) Filed: Oct. 2, 2020

(65) Prior Publication Data
US 2022/0109452 A1    Apr. 7, 2022

(51) Int. Cl.
*H03M 3/00*          (2006.01)

(52) U.S. Cl.
CPC ........... *H03M 3/464* (2013.01); *H03M 3/406* (2013.01); *H03M 3/412* (2013.01); *H03M 3/452* (2013.01)

(58) Field of Classification Search
CPC ...... H03M 3/464; H03M 3/406; H03M 3/452; H03M 3/412
See application file for complete search history.

(56) References Cited

U.S. PATENT DOCUMENTS

| | | | | |
|---|---|---|---|---|
| 5,057,839 A | * | 10/1991 | Koch | H03M 3/47 341/143 |
| 6,584,157 B1 | * | 6/2003 | Van Der Zwan | H03M 3/41 375/247 |
| 7,944,378 B1 | * | 5/2011 | Pesenti | H03M 1/1061 341/118 |
| 8,547,077 B1 | | 1/2013 | Chang | |
| 8,779,958 B1 | * | 7/2014 | Maurino | H03M 3/35 341/144 |
| 8,907,829 B1 | * | 12/2014 | Naderi | H03M 3/496 341/143 |
| 9,800,262 B1 | * | 10/2017 | Maurino | H03M 1/08 |
| 2003/0067405 A1 | | 4/2003 | Keaveney et al. | |
| 2004/0113828 A1 | * | 6/2004 | Doerrer | H03M 3/37 341/159 |
| 2007/0236375 A1 | * | 10/2007 | Andre | H03M 3/464 341/143 |
| 2008/0062022 A1 | * | 3/2008 | Melanson | H03M 3/464 341/143 |
| 2011/0025537 A1 | * | 2/2011 | Kim | G06G 7/186 341/143 |

(Continued)

FOREIGN PATENT DOCUMENTS

CN          110875742 A      3/2020

OTHER PUBLICATIONS

International Search Report and Written Opinion received for PCT Application No. PCT/US2021/053294 dated Nov. 18, 2021, 7 pages.

*Primary Examiner* — Lam T Mai
(74) *Attorney, Agent, or Firm* — John R. Pessetto; Charles A. Brill; Frank D. Cimino

(57) ABSTRACT

A delta-sigma modulator includes a first amplifier having an input, a feedback control input, and an output. The input is a first input of the delta-sigma modulator. The delta-sigma modulator further includes a first integrator and a first quantizer. The first integrator has an input and an output. The output of the first amplifier is coupled to the input of the first integrator. The first quantizer has an input and an output. The output of the first quantizer is coupled to the feedback control input of the first amplifier.

28 Claims, 6 Drawing Sheets

(56) References Cited

U.S. PATENT DOCUMENTS

| | | | |
|---|---|---|---|
| 2011/0095925 A1* | 4/2011 | Matsumoto | H03M 3/332 341/143 |
| 2013/0050003 A1* | 2/2013 | Wang | H03M 3/342 341/143 |
| 2014/0218223 A1* | 8/2014 | Darshan | H03M 3/474 341/143 |
| 2015/0102951 A1 | 4/2015 | Watanabe | |
| 2015/0365102 A1* | 12/2015 | Ceballos | H03M 3/32 341/143 |
| 2016/0197619 A1* | 7/2016 | Katayama | H03M 1/12 341/143 |
| 2019/0363731 A1 | 11/2019 | Nezuka | |

* cited by examiner

DELTA SIGMA MODULATOR

BACKGROUND

Analog signals are processed through a variety of different types of "signal chains." A signal chain includes one or more electrical components. In one example, a signal chain includes an analog-to-digital converter to convert the input analog signal to a digital representation. For many signal chain applications, noise is reduced in one form or fashion to an acceptably low level.

SUMMARY

In one example, a delta-sigma modulator includes a first amplifier having an input, a feedback control input, and an output. The input is a first input of the delta-sigma modulator. The delta-sigma modulator further includes a first integrator and a first quantizer. The first integrator has an input and an output. The output of the first amplifier is coupled to the input of the first integrator. The first quantizer has an input and an output. The output of the first quantizer is coupled to the feedback control input of the first amplifier.

BRIEF DESCRIPTION OF THE DRAWINGS

For a detailed description of various examples, reference will now be made to the accompanying drawings in which.

DETAILED DESCRIPTION

In general, a signal chain receives an input analog signal, processes the input analog signal, and generates an output signal. The input analog signal generally has noise superimposed on the signal itself. The signal chain circuitry may also generate noise such that, even if the input signal were noise-free, the output signal from the signal chain would still be noisy. The noise generated by the signal chain circuitry results in noise on the output signal. The term "input referred noise" refers to an amount of noise that, if added to the input signal, would result in the same amount of output noise if the signal chain circuitry were noise-free. One technique for reducing input referred noise is to connect a programmable gain amplifier (PGA) to the front-end of the signal chain. The PGA amplifies the input signal and thus increases the signal-to-noise ratio (SNR) with respect to the input referred noise. However, amplifying the input signal reduces the dynamic range of the input signal, that is, larger input signals will cause the PGA to saturate and its output signal to clip at the power supply voltage of the PGA. The examples described herein provide a different architecture to increase the SNR.

Figure 1:
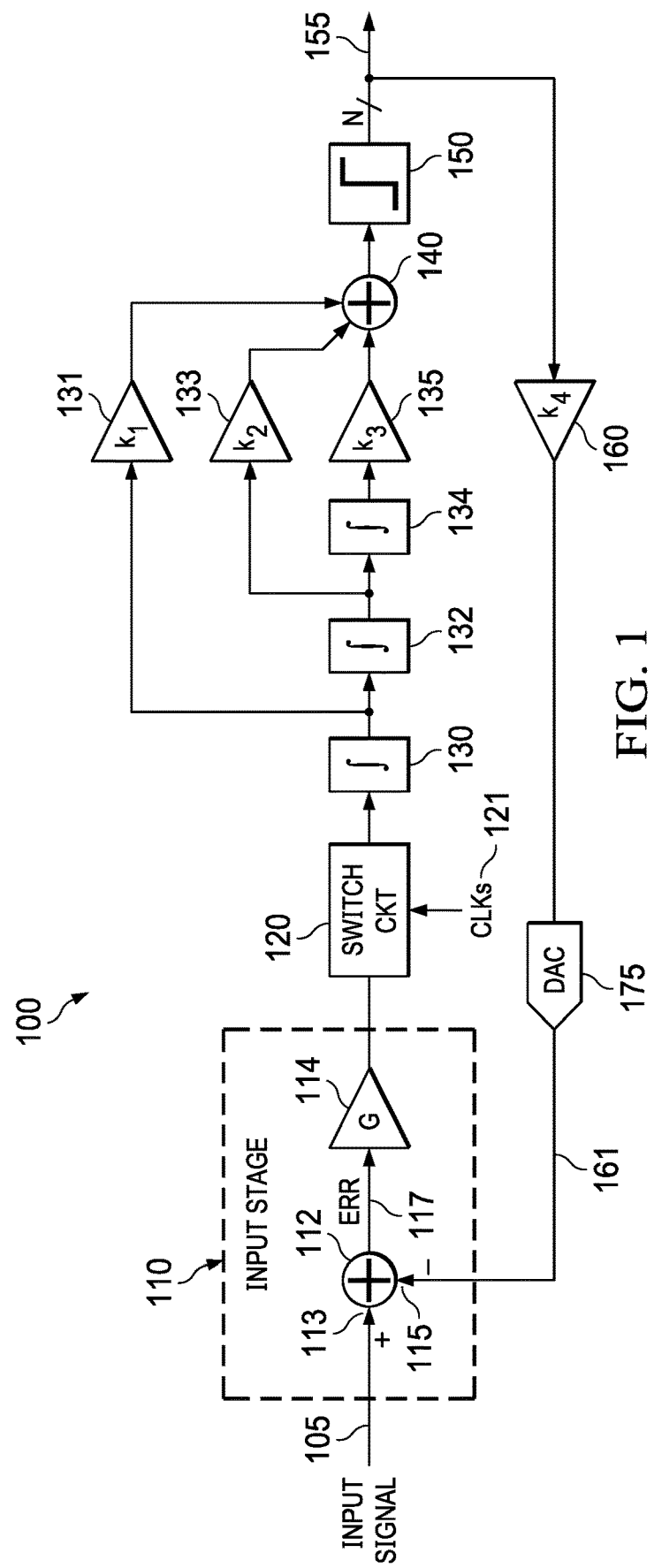
FIG. 1 illustrates a block diagram of delta-sigma modulator with an amplifier provided within the modulator's control loop to increase the signal-to-noise ratio

FIG. 1 shows an example of a continuous time delta-sigma modulator 100, such as is usable within an analog-to-digital converter (ADC). The delta-sigma modulator 100 has an input 105 and an output 155. The input 105 is an input of the input stage 110. Besides the input stage 110, the delta-sigma modulator 100 includes a switch circuit 120, integrators 130, 132, and 134, a summer 140, a quantizer 150, and a digital-to-analog converter (DAC) 175. Gain stages K1, K2, K3, and K4 represent the gains inherent to integrators 130, 132, 134 and DAC 175, respectively. The output of the input stage 110 is coupled to the input of the switch circuit 120, and the output of the switch circuit 120 is coupled to the input of integrator 130. Integrators 130, 132, and 134 are connected serially as shown, and the outputs of integrators 130, 132, and 134 are coupled to inputs of summer 140 which adds together the integrators' output signals. The output of summer 140 is coupled to the input of quantizer 150. The quantizer 150 (as is the case with the quantizers shown in the other figures) is any suitable type of analog-to-digital converter (ADC). Example quantizers include flash ADCs, successive approximation register ADCs (SAR ADCs), pipeline ADCs, etc. The output of quantizer 150 is the digital output signal 155 of the delta-sigma modulator 100 and is coupled to an input of DAC 175. DAC 175 converts the digital output signal 155 from the quantizer 150 to an analog feedback signal 161, which is provided to the input stage 110. The example delta-sigma modulator 100 in FIG. 1 has three integrators and is thus a third order delta-sigma modulator. The principles described herein to increase the SNR are applicable to delta-sigma modulators other than third order delta-sigma modulators (e.g., second order or fourth order delta-sigma modulators).

The input stage 110 includes a summer 112 and an amplifier 114. The summer has inputs 113 and 115. The delta-sigma modulator's input 105 is provided to summer input 113 and the output of the quantizer 150 is converted back to analog through DAC 175 and provided to the summer input 115. The summer 112 subtracts the analog feedback signal 161 from the input signal on input 105 to produce an error signal (ERR) 117. With the feedback control loop implemented by the delta-sigma modulator, for a multi-bit quantizer (e.g., N greater than or equal to 4, where N is the number of bits of the quantizer) ERR 117 will generally be a small signal despite changes in the input signal on input 105. ERR 117 is provided to, and amplified by, amplifier 114. The amplified output signal 119 from amplifier 114 is an amplified version of ERR 117 and is provided to the input of integrator 130. The amplification provided by amplifier 114 increases the SNR of the modulator 100 by suppressing the noise from integrators. Advantageously, because ERR 117 (to be amplified by amplifier 114) has a relatively small magnitude, amplifier 114 does not saturate despite substantial changes in the magnitude of the input signal on input 105. If amplifier 114 had been positioned to amplify the modulator's input signal before being provided to the summer 112, the input referred noise of the signal chain would have been improved but the dynamic range of the input signal would have been reduced. By including amplifier 114 as shown within the control loop implemented by the delta-sigma modulator, the SNR of the delta-sigma modulator 100 is improved (compared to not having the amplifier 114 at all) while maintaining a relatively large dynamic range of the modulator's input signal.

The quantizer 150 is a multi-bit quantizer. As shown in FIG. 1, the output of the quantizer 150 is an N-bit digital value. In one example, N is 3, and in another example, N is 4. When the N-bit output 155 of quantizer 150 changes from one digital value to another, ERR 117 will experience a relatively sudden change as well. As a result of a sudden change in the input signal to the amplifier 114, the amplifier's output signal will take a finite amount of time to settle. The switch circuit 120 electrically decouples the output signal from amplifier 114 from the input to integrator 130 when the amplifier's output is settling, and electrically couples the output signal from amplifier 114 to the integrator's input after the amplifier has had sufficient time to settle. The switch circuit 120 includes switches as explained below that are controlled by clock signals 121 (CLKs). As will be explained below, the timing of the CLKs 121 implements sufficient settling time of the amplifier 114.

Figure 2A:
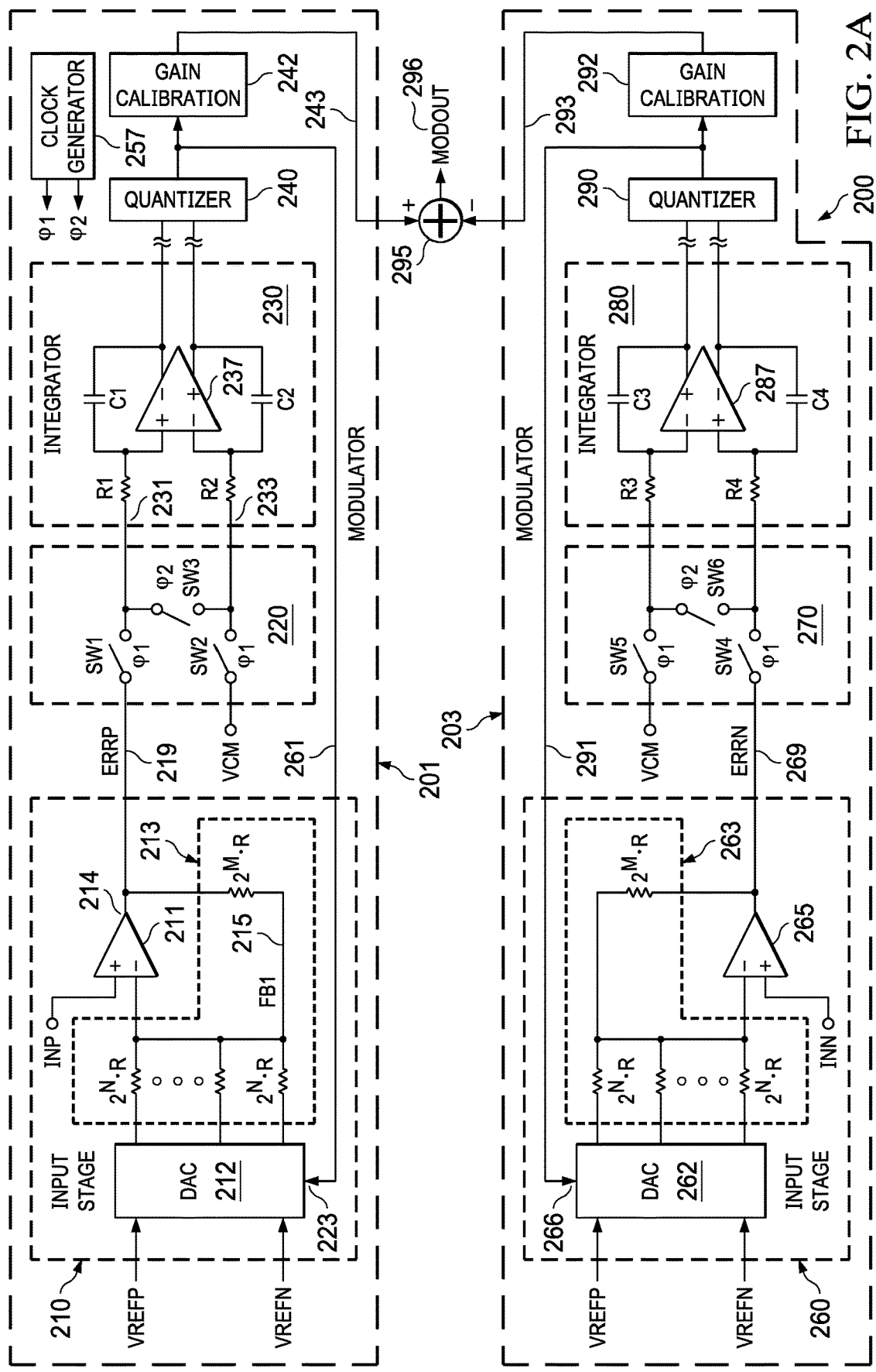
FIG. 2A shows an example implementation of a delta-sigma modulator.

FIG. 2A shows an implementation of the delta-sigma modulator 100 of FIG. 1. The input signal for the delta-sigma modulator 200 of FIG. 2A is a differential signal including positive input signal (INP) and a negative input signal (INN). Delta-sigma modulator 200 includes a modulator 201 for INP and a separate modulator 203 for INN. The output of the modulators 201 and 203 are coupled to summer 295 and the output signal signals 243 and 293 from modulators 201 and 203 are combined together by summer 295 (signal 293 is subtracted from signal 243) to produce the modulator's output signal MODOUT 296. The modulator 201 for INP includes input stage 210, switch circuit 220, integrator 230, one or more additional integrators (not shown), quantizer 240, and gain calibration circuit 242. The modulator 203 for INN is similar and includes input stage 260, switch block 270, integrator 280, one or more additional integrators (not shown), quantizer 290, and gain calibration circuit 292.

For the INP modulator 201, input stage 210 receives input signal INP and input stage 210 is coupled to switch circuit 220. Switch circuit 220, in turn, is coupled to integrator 230. Integrator 230 is coupled to another integrator stage (not shown) and one or more additional integrator stages may be included as desired. The outputs of the INP integrator stages may be summed together and provided to quantizer 240 and the output of quantizer 240 is coupled to the gain calibration circuit 242. As explained above, quantizer 240 is any suitable type of analog-to-digital converter (ADC), such as flash ADCs, successive approximation register ADCs (SAR ADCs), pipeline ADCs, etc. For the INN modulator 203, input stage 260 receives input signal INN and input stage 260 is coupled to switch block 270. Switch block 270, in turn, is coupled to integrator 280. Integrator 280 is coupled to another integrator stage (not shown) and one or more additional integrator stages may be included as desired. The output of the INN integrator stages may be summed together and provided to quantizer 290 and the output of quantizer 290 is coupled to the gain calibration circuit 292. The output of the gain calibration circuits 242 and 292 are provided to summer 295 and summer 295 subtracts the output signal from gain calibration circuit 292 from the output signal from the gain calibration circuit 242. The example delta-sigma modulator 200 of FIG. 2A is a pseudo-differential modulator in that separate modulators 201/203 are included for the INP and INN signals. That is, the difference between INP and INN is not being processed by a single modulator. Instead, each signal (INP and INN) is processed separately by its own modulator and the summer 295 combines the outputs of each of the INP and INN signal chains together to produce a single modulator output signal MODOUT 296.

Input stage 210 includes a DAC 212 (which, along with DAC 262, implements DAC 175 of FIG. 1), resistors 213, and an operational-amplifier (OP AMP) 211. DAC 212 may comprise one or more switches DAC and receives reference voltages VREFP and VREFN which are used by DAC 212 to convert the digital signal 261 from quantizer 240 to an analog voltage for input to the negative input of OP AMP 211. The combination of the OP AMP 211, DAC 212, and resistors 213 implements an inverting DAC with a gain of 2M (where M<N). The analog input signal INP is connected to the positive input of OP AMP 211 and is amplified by a factor of $(1+2^M)$ at the output 214 of OP AMP 211. The output signal of input stage 210 (ERRP 219) is in effect the difference between the analog input INP and the modulator's quantized output gained by a factor of $2^M$. The gain of the DAC 212 is $2^M$. However, for the delta sigma modulator 200, the transfer function is $1+\frac{1}{2}^M$ for the input signal INP to the output of the modulator. As such, the scaling for the input signal is slightly different which changes the gain of the modulator. This gain can be adjusted in the digital domain. Input stage 210 is an amplifier coupled between the modulator's INP input and integrator 230 and thus within a first control loop of the delta-sigma modulator formed by the input stage 210 (amplifier), integrator 230 (and additional integrators if present), and quantizer 240.

Figure 2B:
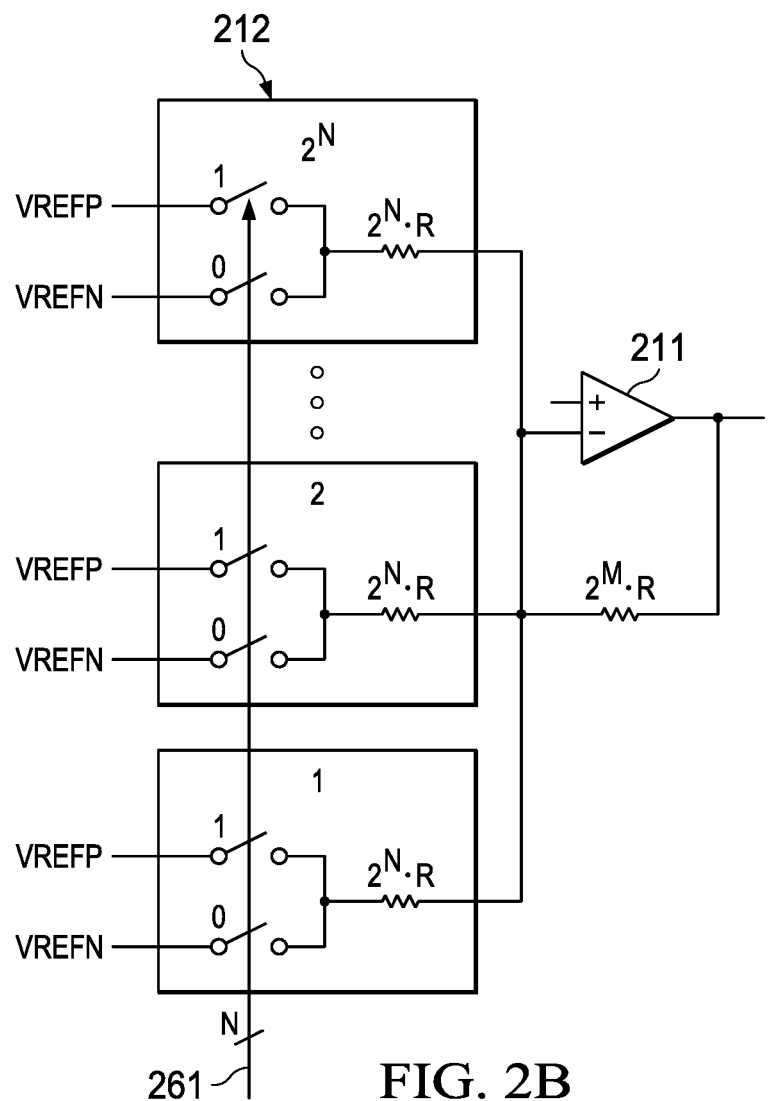
FIG. 2B shows an example implementation of a digital-to-analog converter (DAC) usable in the delta-sigma modulators described herein.

The feedback signal FB1 215 is modified by the DAC 212 under control of the quantizer output's digital signal 261. DAC 212 includes a feedback control input 223 which receives the digital signal 261 from the quantizer 240. FIG. 2B shows an example implementation of DAC 212 and is applicable to the implementation of DAC 262 and DACs 512 and 562 in FIG. 5 as well. In FIG. 2B, DAC 212 includes a pair of switches for each bit of the N-bit digital signal 261 from quantizer 240. Each bit of digital signal 261 causes one switch or the other to be closed. In the example shown, if a given bit of the digital signal 261 is a 1, the top switch of each corresponding pair closes thereby connecting VREFP to the negative input of the OP AMP 211. If the bit is a 0, VREFN is connected to the negative input of the OP AMP 211 instead.

The input stage 260 for the INN signal is similarly configured and includes an OP AMP 265, DAC 262 (which may comprise switches), and resistors 263. DAC 262 includes a feedback control input 266 which receives the digital signal 291 from the quantizer 290. DAC 262 is controlled by the digital output signal 291 of quantizer 290 similar to DAC 212 described above. Input stage 260 is an amplifier coupled between the modulator's INN input and integrator 230, and thus within a second control loop of the delta-sigma modulator formed by the input stage 260 (amplifier), integrator 280 (and additional integrators if present), and quantizer 290. The output signal from the input stage 260 is shown as ERRN 269. Error signals ERRP 219 and ERRN 269 represent error signal ERR 117 of FIG. 1.

Figure 2C:
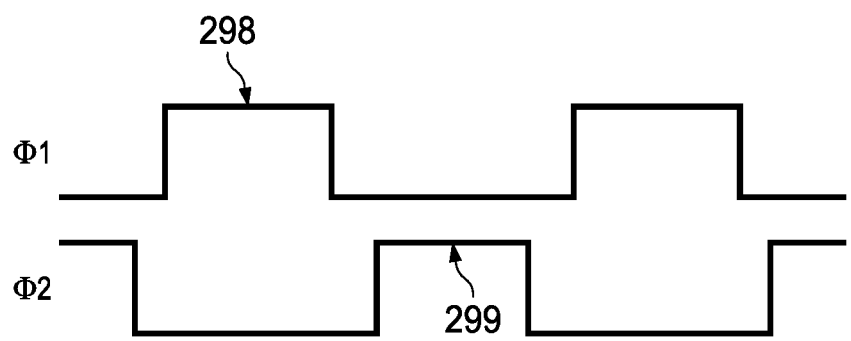
FIG. 2C is a timing diagram of clock signals usable to control the delta sigma modulators' switch circuits described herein.

The switch circuit 220 includes switches SW1-SW3. SW1 is coupled between the output of OP AMP 211 and input 231 of integrator 230. SW2 is coupled between a common voltage (VCM) and input 233 of integrator 230. SW3 is coupled between the inputs 231 and 233 of integrator 230. Switches SW1 and SW2 are controlled by a clock signal φ1 and switch SW3 is controlled by clock signal φ2 (φ1 and φ2) comprise CLKs 121 from FIG. 1). The relationship between φ1 and φ2 is such that when φ1 causes switches SW1 and SW2 to close, φ2 is in a state to cause SW3 to be open, and when φ2 is in a state to cause SW3 to close, φ1 is in a state to cause SW1 and SW2 to be open—that is, all three switches SW1-SW3 are not closed at the same time. FIG. 2C shows a timing diagram illustrating the relationship of clocks φ1 and φ2. When φ1 is high as shown at 298, φ2 is low. Conversely, when φ2 is high as shown at 299, φ1 is low. Each clock signal has a low phase that has a longer duration than its high phase. A clock generator 257 is included to generate the clocks φ1 and φ2.

By the timing implemented by the clocks signals φ1 and φ2, when the output of OP AMP 211 is settling (which will take a finite amount of time when the output digital signal 261 of quantizer 260 changes state), the switch circuit 220 is configured to cause SW1 and SW2 to be open (and SW3 closed) thereby decoupling the output of the OP AMP 211 from the input of integrator 230. After the output of OPAMP 211 has settled, the switch circuit causes SW1 and SW2 to be closed (and SW3 open) thereby coupling the output of the OP AMP 211 to the input of integrator 230. The timing relationship of the clocks φ1 and φ2 provides time for the OP AMP 211 output to sufficiently settle. For example, φ2 is high for a long enough period of time for OP AMP 211 to sufficiently settle.

The configuration and operation of switch circuit 270 is similar to that of switch circuit 220. Switch circuit 270 includes switch SW4 coupled between the output of OP AMP 265 of input stage 260 and integrator 280 and includes SW5 coupled between VCM and integrator 280. SW6 is coupled across the inputs of integrator 280. SW4 and SW5 are controlled with the same clock φ1 as SW1 and SW2 and switch SW6 is controlled by φ2. As such, the output signals from input stages 210 and 260 are provided to the inputs of the respective integrators after the output of OP AMPS 211 and 265 have settled and are decoupled from the respective integrators when the OP AMPS 211 and 265 are settling.

Integrator 230 includes an OP AMP 237, resistors R1 and R2 and capacitors C1 and C2. Similarly, integrator 280 includes an OP AMP 287, resistors R3 and R4 and capacitors C3 and C4. Additional integrator stages may be provided as well and similarly configured as shown for integrators 230 and 280.

Quantizers 240 and 290 produce multi-bit (e.g., N equals 4-bit) digital output signals 261 and 291 based on the respective analog input signals from the integrator stages. The gain calibration stages 242 and 292 ensure that the gains are the same of the INP and INN modulators 201 and 203. Otherwise gain mismatches in the two paths leads to reduced common mode rejection ratio (CMRR) and poor CMRR is a disadvantage of conventional types of continuous time delta-sigma modulators.

Figure 3:
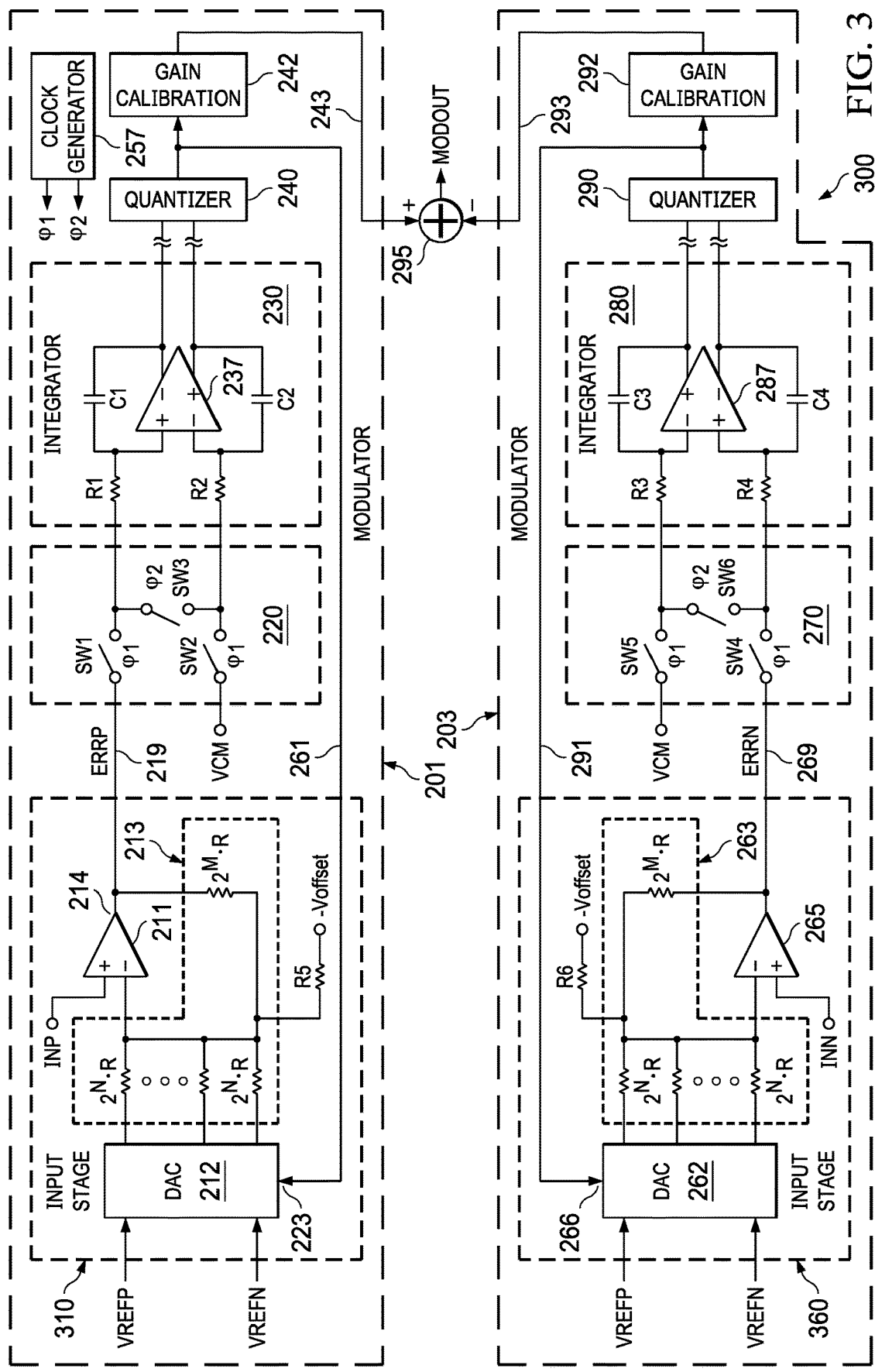
FIG. 3 shows another example of an implementation of a delta-sigma modulator.

FIG. 3 shows an example of a delta-sigma modulator 300 similar to delta-sigma modulator 200 of FIG. 2A. The delta-sigma modulator 300 includes the same stages and in the same configuration as for delta-sigma modulator 200. The input stages are numbered differently (310 and 360 instead of 210 and 260) to indicate the difference that a negative offset voltage (−Voffset) is coupled through respective resistors R5 and R6 to resistors 213 and 263. The architecture of FIG. 3 is useful for applications in which the input can be a 0V and only have unipolar supply (e.g., INN is ground and INP varies with respect to ground). The output signals of OP AMPs 211 and 265 are centered around the Vcm voltage which can be chosen to be mid-supply. Without the additional branch when the input INP is 0 the quantizer output and corresponding DAC feedback on average needs to be 0V for the control loop to work correctly. Because of the quantization noise the quantizer output will be sometimes more than 0 and other time needs to be lower than 0V. With unipolar supply the DAC output cannot go below zero. Adding an additional branch through R5 and adding a negative offset adds a positive input to the modulator control loop. The output code and corresponding DAC output in this case on average will be greater than 0 and will remain greater than zero even in the presence of quantization noise. With this additional branch the modulator works properly with 0V input even with unipolar supplies. For the control loop of the delta-sigma modulator to work correctly, the DAC's output voltage should become a few least significant bit (LSBs) below 0V. The negative offset voltage (−Voffset) is added to shift the output code from the DACs.

Figure 4:
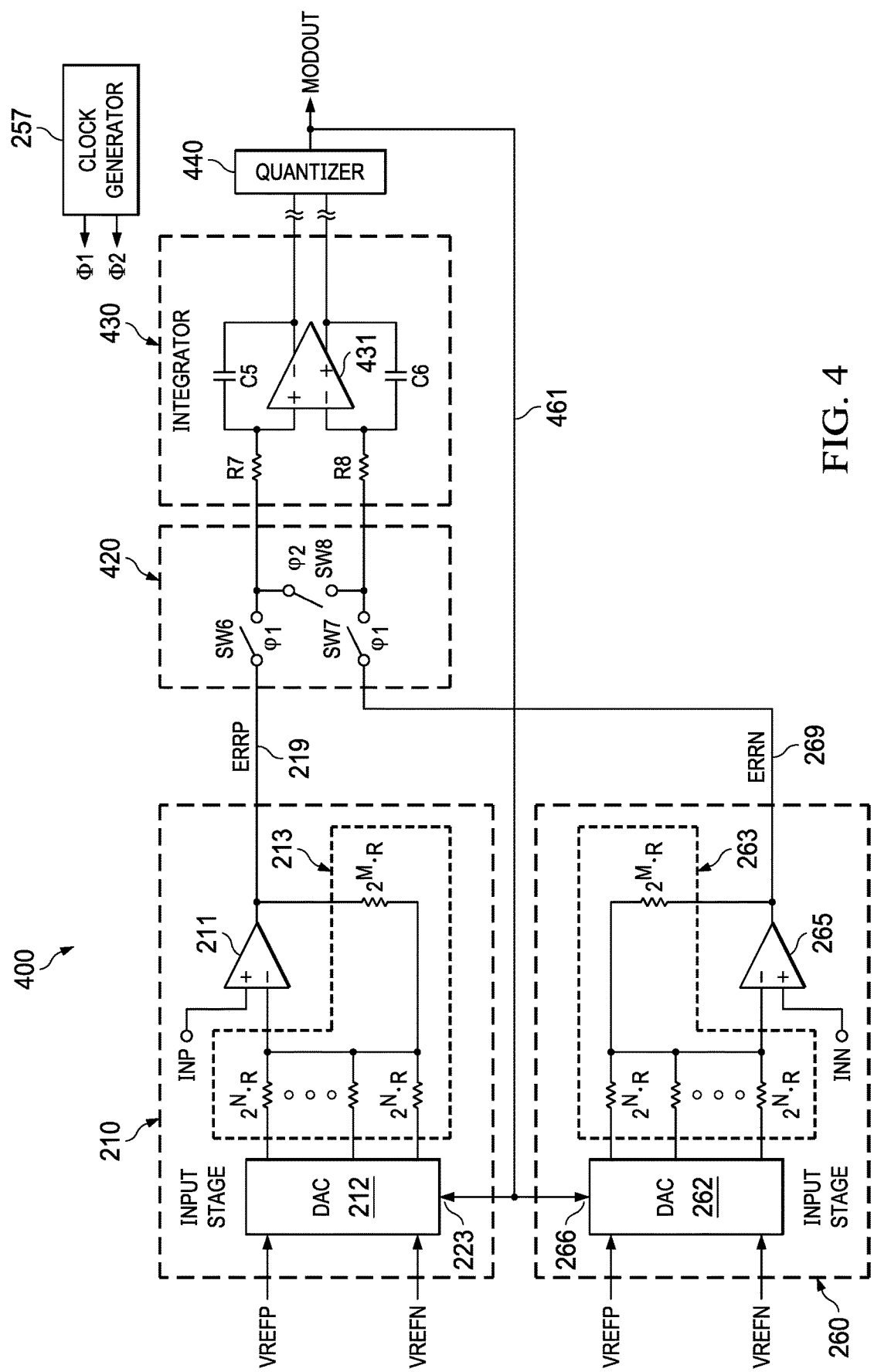
FIG. 4 shows yet another example of an implementation of a delta-sigma modulator.

FIG. 4 shows an example of a delta-sigma modulator 400 that is fully differential in contrast to the pseudo differential examples of FIGS. 2A and 3. A single modulator operates on the difference between the inputs INP and INN instead of having two separate modulators for INP and INN. The delta-sigma modulator 400 includes input stages 210 and 260, a switch circuit 420, an integrator 430, one more additional integrator stages (not shown) and a quantizer 440. The input stages 210 and 260 are as described above, and each input stage is an amplifier coupled between the respective modulator input and integrator 430. Rather than each input stage being coupled to a separate switch circuit, the outputs of OP AMPS 211 and 265 are coupled to a common switch circuit 420, and thus through the common switch circuit 420 to a common chain of integrators. That is, rather than each input signal INP and INN having its respective set of switch circuit and integrators, the outputs of the amplifiers of the input stages are combined together by way of a common switch circuit and a common set of integrators is used. The switch circuit includes switches SW6-SW8 configured as described above for the previously described switch circuits. When closed (by clock signal φ1 after the OP AMP's outputs have settled), SW6 and SW7 provide output signals from OP AMPS 211 and 265 to the integrator 430. When closed (by clock signal φ2), SW8 prevents the integrator 430 from integrating the input stages' output signals while the input stage output signals are settling. Integrator 430 includes OP AMP 431, resistors R7 and R8, and capacitors C5 and C6 configured in much the same as the integrators described above.

A single quantizer 440 is used to quantize the integrator's output signal. The output signal 461 of quantizer 440 controls the DACs 212 and 262. The benefit of this approach includes reduced area of the modulator 400 and reduced power consumption as a single modulator is being used compared to the two modulators for the pseudo differential approach. However, the input common mode (INP+INN)/2 should be close to the reference common mode (VREFP+ VREFN)/2 which may limit the use of the modulator in some applications.

Figure 5:
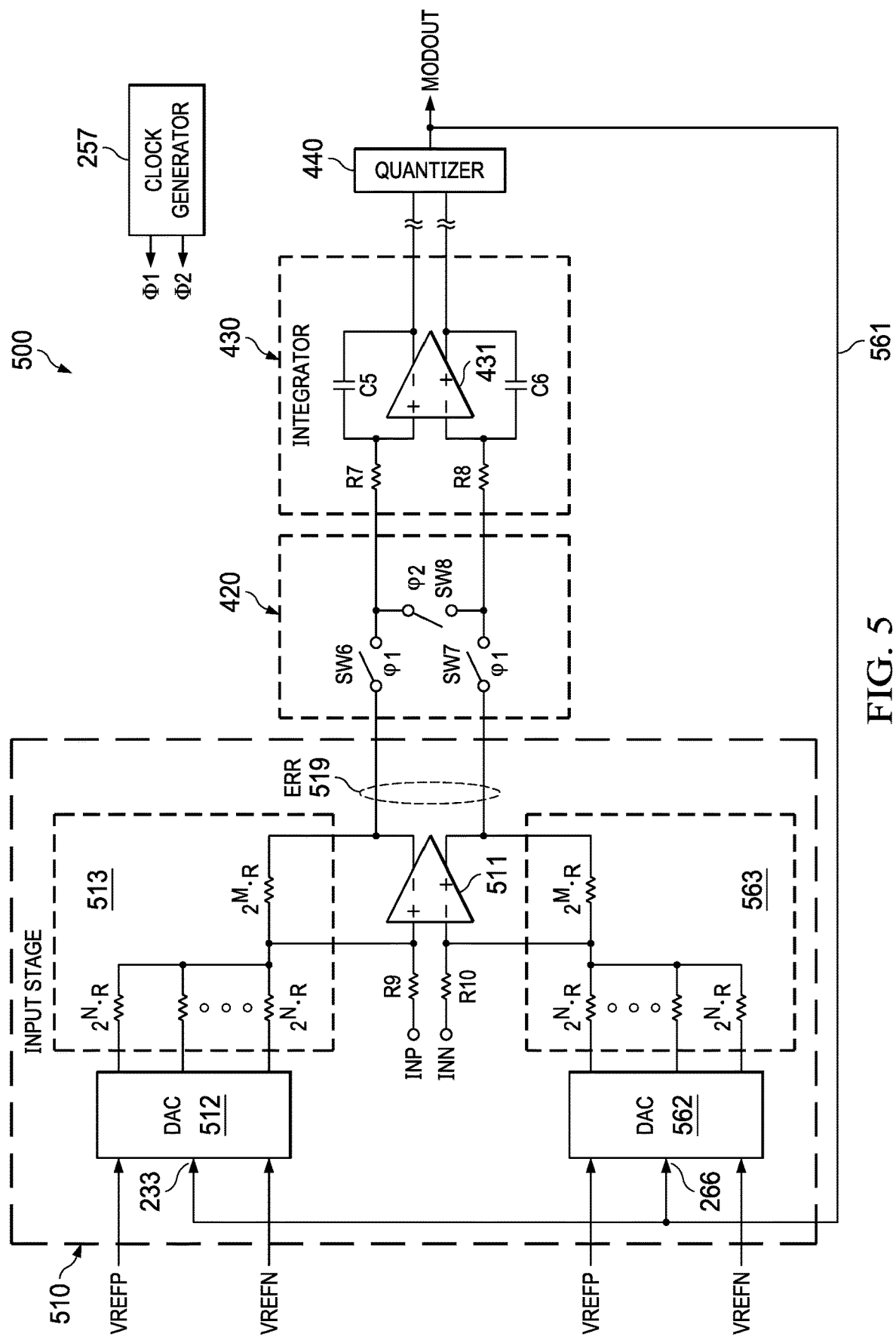
FIG. 5 shows another example of an implementation of a delta-sigma modulator.

FIG. 5 shows another example of a fully differential delta-sigma modulator 500. Modulator 500 includes an input stage 510, switch circuit 420, integrator 430 (and one more additional integrator stages, not shown), and quantizer 440. Input stage 510 includes a common OP AMP 511 used by both input signals INP and INN. INP is coupled to the positive input of OP AMP 511 via an input resistor R9. INN is coupled to the negative input of OMP AMP 511 via input resistor R10. Input stage 510 also includes DAC 512 and resistors 513 as well as DAC 562 and resistors 563. The digital output signal 561 of quantizer 440 is used to control both DACs 512 and 562. Input stage 510 is a differential amplifier coupled between the modulator's inputs and integrator 430, and provides error signal ERR 519 (a differential error signal) to integrator 430 via switch circuit 420. The modulator 500 is fully differential and thus occupies less area and consumes less power than a pseudo-differential implementation which has multiple modulators (e.g., FIGS. 2 and 3). The modulator 500 of FIG. 5 also does not have a limitation on input common mode voltage with respect to reference common mode voltage. One difference from the previous implementations is that both the DACs 512 and 562 and the input signals INP and INN have the same corresponding gain (2M) so there no gain adjustment is needed in the digital domain. However, the common mode rejection ratio of modulator 500 may be smaller than that of the pseudo differential modulators of FIGS. 2 and 3 because of mismatch between the resistors 513 and the corresponding resistors 563. Further, the input resistors R9 and R10 may result in a smaller input impedance than the example modulators with no input resistors through INP and INN are coupled to the respective OP AMPs.

The term "coupled" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. A delta-sigma modulator, comprising:
    a first input of the delta-sigma modulator;
    a first integrator having an input and an output;
    a first amplifier coupled between the first input of the delta-sigma modulator and the input of the first integrator;
    a second input of the delta-sigma modulator;
    a second integrator having an input and an output; and
    a second amplifier coupled between the second input of the delta-sigma modulator and the input of the second integrator.

2. The delta-sigma modulator of claim 1, wherein the first amplifier has an output, and the delta-sigma modulator further includes a switch circuit coupled between the output of the first amplifier and the input of the first integrator.

3. The delta-sigma modulator of claim 2, wherein the switch circuit includes a first switch coupled between the output of the first amplifier and the input of the first integrator.

4. The delta-sigma modulator of claim 2, wherein the switch circuit is configured to
    decouple the output of the first amplifier from the input of the first integrator as the amplifier begins to settle; and
    subsequently couple the output of the first amplifier to the input of the first integrator.

5. The delta-sigma modulator of claim 1, wherein the first amplifier has an output and the second amplifier has an output, and the delta-sigma modulator further includes:
    a first switch circuit coupled between the output of the first amplifier and the input of the first integrator;
    a second switch circuit coupled between the output of the second amplifier and the input of the second integrator;
    a first quantizer having an input and an output, the input of the first quantizer is coupled to the output of the first integrator;
    a second quantizer having an input and an output, the input of the second quantizer is coupled to the output of the second integrator; and
    a summer having a first summer input and a second summer input, the first summer input is coupled to the output of the first quantizer and the second summer input is coupled to the output of the second quantizer.

6. The delta-sigma modulator of claim 1, wherein the first amplifier has an output, the first integrator has first and second inputs, and the delta-sigma modulator further includes:
    a second input of the delta-sigma modulator;
    a second amplifier coupled to the second input of the delta-sigma modulator, the second amplifier having an output;
    a switch circuit having first and second switch circuit inputs and first and second switch circuit outputs;
    the first switch circuit input is coupled to the output of the first amplifier;
    the second switch circuit input is coupled to the output of the second amplifier;
    the first switch circuit output is coupled to the first input of the first integrator; and
    the second switch circuit output is coupled to the second input of the first integrator.

7. A delta-sigma modulator, comprising:
    a first amplifier having an input, a feedback control input, and an output, the input being a first input of the delta-sigma modulator;
    a first integrator having an input and an output, the output of the first amplifier coupled to the input of the first integrator;
    a first quantizer having an input and an output, the output of the first quantizer coupled to the feedback control input of the first amplifier;
    a second integrator having an input and an output; and
    a second amplifier having an input, a feedback control input, and an output, the output of the second amplifier coupled to the input of the second integrator.

8. The delta-sigma modulator of claim 7, wherein the first amplifier includes a digital-to-analog converter coupled to the output of the first quantizer.

9. The delta-sigma modulator of claim 7, further comprising a switch circuit coupled between the output of the first amplifier and the input of the first integrator.

10. The delta-sigma modulator of claim 9, wherein the switch circuit includes a first switch coupled between the output of the first amplifier and the input of the first integrator.

11. The delta-sigma modulator of claim 9, wherein the switch circuit is configured to:
    electrically decouple the output of the first amplifier from the input of the first integrator when the amplifier is settling; and
    electrically couple the output of the first amplifier to the input of the first integrator after the first amplifier has settled.

12. The delta-sigma modulator of claim 7, further including:
    a first switch circuit coupled between the output of the first amplifier and the input of the first integrator;
    a second switch circuit coupled between the output of the second amplifier and the input of the second integrator.

13. The delta-sigma modulator of claim 7, further including:
    a summer having a first summer input and a second summer input, the first summer input is coupled to the output of the first quantizer and the second summer input is coupled to the output of the second quantizer.

14. A delta-sigma modulator, comprising:
a first integrator having an input and an output;
a first quantifier having an input and an output, the output of the first integrator coupled to the input of the quantizer, the first integrator and the quantizer forming a first control loop;
a first amplifier included within the first control loop of the delta-sigma modulator;
wherein the first amplifier includes an input comprising a first input of the delta-sigma modulator, and the delta-sigma modulator further comprising a second amplifier;
wherein the second amplifier has an output coupled to the first integrator.

15. The delta-sigma modulator of claim 14, wherein the first amplifier is a differential amplifier.

16. The delta-sigma modulator of claim 14, wherein the output of the first amplifier is coupled to the input of the first integrator, and the delta-sigma modulator further comprises a second integrator having an input and an output, and:
the second amplifier has an input and an output, the input of the second amplifier being a second input of the delta-sigma modulator, and the output of the second amplifier is coupled to the input of the second integrator.

17. An analog-to-digital converter (ADC) comprising:
delta-sigma modulator comprising:
a first input of the delta-sigma modulator;
a first integrator having an input and an output;
a first amplifier coupled between the first input of the delta-sigma modulator and the input of the first integrator;
a second input of the delta-sigma modulator;
a second integrator having an input and an output; and
a second amplifier coupled between the second input of the delta-sigma modulator and the input of the second integrator.

18. The ADC of claim 17, wherein the first amplifier has an output, and the delta- sigma modulator further includes a switch circuit coupled between the output of the first amplifier and the input of the first integrator.

19. The ADC of claim 18, wherein the switch circuit includes a first switch coupled between the output of the first amplifier and the input of the first integrator.

20. The ADC of claim 18, wherein the switch circuit is configured to
decouple the output of the first amplifier from the input of the first integrator as the amplifier begins to settle; and
subsequently couple the output of the first amplifier to the input of the first integrator.

21. The ADC of claim 17, wherein the first amplifier has an output and the second amplifier has an output, and the delta-sigma modulator further includes:
a first switch circuit coupled between the output of the first amplifier and the input of the first integrator;
a second switch circuit coupled between the output of the second amplifier and the input of the second integrator;
a first quantizer having an input and an output, the input of the first quantizer is coupled to the output of the first integrator;
a second quantizer having an input and an output, the input of the second quantizer is coupled to the output of the second integrator; and
a summer having a first summer input and a second summer input, the first summer input is coupled to the output of the first quantizer and the second summer input is coupled to the output of the second quantizer.

22. The ADC of claim 18, wherein the first amplifier has an output, the first integrator has first and second inputs, and the delta-sigma modulator further includes:
a second input of the delta-sigma modulator;
a second amplifier coupled to the second input of the delta-sigma modulator, the second amplifier having an output;
a switch circuit having first and second switch circuit inputs and first and second switch circuit outputs;
the first switch circuit input is coupled to the output of the first amplifier;
the second switch circuit input is coupled to the output of the second amplifier;
the first switch circuit output is coupled to the first input of the first integrator; and
the second switch circuit output is coupled to the second input of the first integrator.

23. A An analog-to-digital converter (ADC) comprising:
delta-sigma modulator, the delta-sigma modulator comprising:
a first amplifier having an input, a feedback control input, and an output, the input being a first input of the delta-sigma modulator;
a first integrator having an input and an output, the output of the first amplifier coupled to the input of the first integrator;
a first quantizer having an input and an output, the output of the first quantizer coupled to the feedback control input of the first amplifier;
a second integrator having an input and an output; and
a second amplifier having an input, a feedback control input, and an output,
the output of the second amplifier coupled to the input of the second integrator.

24. The ADC of claim 23, wherein the first amplifier includes a digital-to-analog converter coupled to the output of the first quantizer.

25. The ADC of claim 23, further comprising a switch circuit coupled between the output of the first amplifier and the input of the first integrator.

26. The ADC of claim 25, wherein the switch circuit includes a first switch coupled between the output of the first amplifier and the input of the first integrator.

27. The ADC of claim 25, wherein the switch circuit is configured to:
electrically decouple the output of the first amplifier from the input of the first integrator when the amplifier is settling; and
electrically couple the output of the first amplifier to the input of the first integrator after the first amplifier has settled.

28. The ADC of claim 23, further including:
a first switch circuit coupled between the output of the first amplifier and the input of the first integrator;
a second switch circuit coupled between the output of the second amplifier and the input of the second integrator.

* * * * *